United States Patent
Lingunis et al.

(10) Patent No.: US 7,098,546 B1
(45) Date of Patent: Aug. 29, 2006

(54) ALIGNMENT MARKS WITH SALICIDED SPACERS BETWEEN BITLINES FOR ALIGNMENT SIGNAL IMPROVEMENT

(75) Inventors: Emmanuil H. Lingunis, San Jose, CA (US); Jean Yee-Mei Yang, Sunnyvale, CA (US); Hidehiko Shiraiwa, San Jose, CA (US)

(73) Assignee: Fasl LLC, Sunnyvale, CA (US)

( * ) Notice: Subject to any disclaimer, the term of this patent is extended or adjusted under 35 U.S.C. 154(b) by 134 days.

(21) Appl. No.: 10/869,286

(22) Filed: Jun. 16, 2004

(51) Int. Cl.
*H01L 23/544* (2006.01)
*H01L 21/76* (2006.01)

(52) U.S. Cl. .................................. 257/797; 438/401
(58) Field of Classification Search ............. 438/401, 438/682; 257/797
See application file for complete search history.

(56) References Cited

U.S. PATENT DOCUMENTS

| | | |
|---|---|---|
| 6,342,426 B1 | 1/2002 | Li et al. |
| 6,436,766 B1 * | 8/2002 | Rangarajan et al. ........ 438/261 |
| 2004/0145066 A1 * | 7/2004 | Swanson et al. ............ 257/797 |
| 2004/0212009 A1 * | 10/2004 | Wang et al. ................ 257/317 |

OTHER PUBLICATIONS

Wolf et al., Silicon Processing for the VLSI Era, vol. 2, 2nd edition, Lattice Press, 2000, pp. 268, 606-607, 726.*

* cited by examiner

*Primary Examiner*—Carl Whitehead, Jr.
*Assistant Examiner*—Heather Doty
(74) *Attorney, Agent, or Firm*—Eschweiler & Associates, LLC

(57) ABSTRACT

The present invention pertains to utilizing a salicide in establishing alignment marks in semiconductor fabrication. A metal layer is formed over exposed portions of a silicon substrate as well as oxide areas formed over bitlines buried within the substrate. The metal layer is treated to react with the exposed portions of the silicon substrate to form salicided areas. The metal layer does not, however, react with the oxide areas. As such, salicided areas are formed adjacent to the oxide areas to provide an enhanced optical contrast when light is shined there-upon. In this manner, the alignment marks can be more readily "seen". The enhanced optical contrast thus allows the marks to continue to be seen as scaling occurs.

20 Claims, 15 Drawing Sheets

US 7,098,546 B1

ALIGNMENT MARKS WITH SALICIDED SPACERS BETWEEN BITLINES FOR ALIGNMENT SIGNAL IMPROVEMENT

FIELD OF INVENTION

The present invention relates generally to photolithography, and more particularly to utilizing salicides in a photolithographic process to establish alignment marks and facilitate improved alignment and registration in a semiconductor fabrication process.

BACKGROUND OF THE INVENTION

In the semiconductor industry, there is a continuing trend toward higher device densities. To achieve these higher densities there has been, and continues to be, efforts toward scaling down and packing more devices on semiconductor wafers. In order to accomplish higher device packing densities, the respective sizes of features making up these devices have to be reduced. This may include reducing the width and spacing of interconnecting lines and the surface geometry such as the corners and edges of various features.

The requirement of small features with close spacing between adjacent features requires high resolution photolithographic processes. In general, lithography refers to processes for pattern transfer between various media. With regard to semiconductor fabrication, lithography generally relates to the process of transferring patterns which correspond to desired circuit components onto one or more thin films which overlie a substrate.

In particular, a silicon slice (e.g., a wafer) is typically uniformly coated with one or more thin films and a radiation-sensitive material (e.g., a resist) is formed over these films. The coated substrate can be baked to evaporate solvents in the resist composition and to fix the resist coating upon the films and substrate. An imaging source (e.g., light, x-rays, an electron beam) can then be utilized to expose or illuminate selected areas of the surface of the resist material through an intervening master template (e.g., a mask or reticle) to transfer a pattern formed within the template onto the wafer. The resist material is generally a radiation-sensitized coating suitable for receiving a projected image of the subject pattern. Once the image from the intervening master template is projected onto the resist coating, it is indelibly formed therein.

Light projected onto the resist layer during the photolithographic process changes properties (e.g., solubility) of the layer of resist material such that different portions thereof (e.g., illuminated or un-illuminated areas, depending upon the type of resist utilized) can be manipulated in subsequent processing steps. For example, regions of a negative resist become insoluble when illuminated by an exposure source such that the application of a solvent to the resist during a subsequent development stage removes only non-illuminated regions of the resist. The pattern formed in the negative resist layer is, thus, the negative of the pattern defined by opaque regions of the template. By contrast, in a positive resist, illuminated regions of the resist become soluble and are removed via application of a solvent during development. Thus, the pattern formed in the positive resist is a positive image of opaque regions on the template.

By way of example, a cross-sectional side view of a portion of one or more layers of a wafer 100 whereon one or more semiconductor structures are produced is illustrated in the FIGS. 1–6. In FIG. 1, a resist layer 102 is deposited over a thin film 104, such as via spin-coating, for example.

The thin film 104 may include, for example, silicon dioxide ($SiO_2$) and overlies a substrate 106 that can comprise silicon, for example. In FIG. 2, the resist layer 102 is selectively exposed to radiation 108 (e.g., ultraviolet (UV) light) via one or more apertures 110 formed within an intervening mask or reticle 112 to generate one or more exposed regions 114 within the resist layer 102.

When the exposed regions 114 are made soluble, a positive image of the mask 112 is produced in the resist layer 102. These features 114 are revealed when a specific solvent or developer is subsequently applied across the wafer 100 as illustrated in FIG. 3. In this situation, the resist material is referred to as a "positive resist". Areas 116 of the film 104 underlying the removed regions 114 of the resist layer 102 may then be subjected to further processing (e.g., etching) to thereby transfer the desired pattern from the mask 112 to the film 104, as illustrated in FIG. 4 (wherein the remaining portions of the resist layer 102 have been stripped away or otherwise removed).

Conversely, when the exposed regions 114 are made insoluble by radiation, a negative image of the mask 112 is produced in the resist layer 102. These features 114 remain when the rest of the resist layer 102 is removed via application of a specific solvent or developer across the wafer 100, as is illustrated in FIG. 5. In this situation, the resist material is referred to as a "negative resist." Revealed areas 118 in the film 104 may then be subjected to further processing (e.g., etching) to thereby transfer into the film 104 desired features 120 from the mask 112, as illustrated in FIG. 6 (wherein the remaining portions of the resist layer 102 have once again been stripped away or otherwise removed).

It can be appreciated that projection lithography is a powerful and important tool in integrated circuit manufacturing, and that to further increase the packing density of integrated circuits, the accuracy with which an image can be positioned upon the surface of a semiconductor substrate and/or one or more thin films formed thereon is of considerable importance. Because integrated circuits are fabricated by patterning a plurality of layers in a particular sequence to generate features that require a particular spatial relationship with respect to one another, each layer must be properly aligned with respect to previously patterned layers. The more accurately layers can be aligned, the more likely it is that packing density can be effectively increased.

Historically, three primary methods have been utilized to optically transfer a pattern to a photoresist covered film. These methods include: contact printing, proximity printing and projection printing and are illustrated in simplified form in FIGS. 7–10, respectively. Each of the methods generally make use of: (1) an illumination source which provides optical energy (e.g., UV light) for transforming the photoresist via exposure, (2) an optical subsystem that focuses the circuit patterns onto the photoresist surface and allows for controlled exposure times, and (3) a movable stage that holds the wafer being exposed.

Contact printing 700, as illustrated in FIG. 7, was the earliest method utilized to produce patterns. Contact printing 700 involves a light source 702, an optical system 704, a mask 706 and a photoresist layer 708 overlying a thin film 710 which, in turn, overlies a semiconductor wafer 720. The mask 706, which contains the desired circuit patterns for transfer to the photoresist layer 708, is positioned (aligned) relative to any existing patterns that already exist on the wafer 720. The mask 706 is then clamped down to the photoresist layer 708, thereby making physical contact with the photoresist layer 708, and exposed with ultraviolet (UV)

light from the light source 702. This method provides for an excellent image transfer and good resolution (e.g., good minimum linewidth spacing).

Contact printing can, however, suffer from the direct contact made between the mask 706 and the photoresist layer 708. For example, the repeated contact made between the mask 706 and the photoresist layer 708 in the process can result in defects being generated within the mask 706 which can in turn then be transferred to subsequently processed wafers. To prevent this problem, the masks 706 must be inspected and cleaned regularly which can be disadvantageous, at least, in terms of cost and processing time. In addition, small particles may be caught between the mask 706 and the photoresist layer 708 when affixing the two elements, thereby preventing the desired direct contact between the mask 706 and the photoresist layer 708. This particulate contamination can result in reduced resolution in the area local to the foreign particle. Consequently, contact printing is not common in modern semiconductor fabrication.

Proximity printing 800, as illustrated in FIG. 8, again made use of a light source 802, an optical system 804, a mask 806 and a photoresist layer 808 overlying a thin film 810 which overlies a semiconductor wafer 820. In proximity printing, the mask 806 is placed near, but not in contact with, the surface of the wafer 820. By introducing a gap 822 between the mask 806 and the wafer 820, the defect problem of contact printing is substantially avoided. Unfortunately, as the gap 822 increases, the resolution of the proximity printing system 800 rapidly deteriorates. For example, a 10 micrometer gap with a 400 nanometer exposure (the wavelength of the light source 802) results in a minimum resolution of about 3 micrometers. In addition, proximity printing 800 requires extremely flat masks 806 and wafers 820 in order to prevent gap variations spatially about the wafer 820. Since many integrated circuits today require features of 0.25 micrometers or less, proximity printing 800 is not considered adequate for many modern semiconductor fabrication processes.

The final optical pattern transfer technique of projection printing is a generic term that encompasses various pattern transfer techniques. These techniques, for example, include: (a) projection scanning systems, (b) reduction (e.g., 4× or 10×) step-and-repeat projection systems, and (c) reduction step-and-scan systems. In each system, lens elements or mirrors are utilized to focus the mask image on the wafer surface (containing the photoresist).

Projection scanning systems (often called scanning projection aligners), use a reflective spherical mirror (reflective optics) to project an image onto the wafer surface, as illustrated, for example, in FIG. 9. The system 900 includes a primary mirror 902 and a secondary mirror 904 which are arranged with the mask 906 and the wafer 908 to image the mask pattern onto the photoresist layer which overlies the film on the wafer 908 (the photoresist layer and the thin film are not shown in FIG. 9 for simplicity). A narrow arc of radiation is imaged from the mask 906 to the wafer 908 through a slit (not shown) with light that travels an optical path that reflects the light multiple times. The mask 906 and the wafer 908 are scanned through the arc of radiation by means of a continuous scanning mechanism (not shown). The scanning technique minimizes mirror distortions and aberrations by keeping the imaging illumination in the "sweet spot" of the imaging system 902 and 904.

FIG. 10 illustrates an exemplary reduction step-and-repeat system 1000 (also called a reduction stepper) that utilizes refractive optics (as opposed to reflective optics as illustrated in FIG. 9) to project a mask image onto a photoresist layer which overlies the film on the wafer 1002. It will be appreciated that the photoresist layer and thin film are not shown in FIG. 10 for purposed of simplicity. The reduction stepper 1000 generally includes a mirror 1004, a light source 1006, a filter 1008, a condenser lens system 1010, a reticle 1012 and a reduction lens system 1014. The mirror 1004 behaves as a collecting optics system to direct as much of the light from the light source 1006 (e.g., a mercury-vapor lamp) to the wafer 1002. The filter 1008 is used to limit the light exposure wavelengths to specified frequencies and bandwidth. The condenser system 1010 focuses the radiation through the reticle 1012 and to the reduction lens system 1014 to thereby focus a "masked" radiation exposure onto a limited portion of the wafer 1002, namely onto a single semiconductor die 1016.

Since it is complex and expensive to produce a lens capable of projecting a mask pattern of an entire 200 millimeter or 300 millimeter wafer, the refractive system 1000, as illustrated in FIG. 10, projects an image 1020 only onto a portion of the wafer 1002 corresponding to an individual semiconductor die 1016. This image is then stepped and repeated across the wafer 1002 in order to transfer the pattern to the entire wafer (thus giving rise to the name "steppers"). Consequently, the size of the wafer is no longer a consideration for the system optics.

The reduction stepper system 1000 thus uses the reticle 1012 instead of a mask. Reticles are similar to masks, but differ in that a mask contains a pattern for transfer to the entire wafer in one exposure while a reticle contains a pattern image for a single or several semiconductor die that must be stepped and repeated across the wafer 1002 in order to expose the entire wafer substrate. The terms "mask" and "reticle" are increasingly used interchangeably and are so used hereinafter. Conventional reduction stepper systems such as the system 1000 utilize reticles that contain a pattern that is an enlargement of the desired image on the wafer 1002 to allow more detailed and accurate patterns to be formed therein. Consequently, the reticle pattern 1020 is reduced in size when projected onto the wafer 120 during exposure (thus giving rise to the name "reduction" stepper).

In addition to stepper systems, scanning step and repeat systems (often called "step and scan systems") have become popular, a simplified example of which 1100 is illustrated in FIG. 11. Step and scan systems differ from scanning systems, such as that depicted in FIG. 9 because instead of the entire wafer being scanned with a mask, each die on the wafer is scanned with a reticle and the system then steps across the wafer and scans each die across the wafer. In FIG. 11, for example, a reticle 1102 having a pattern 1104 formed thereon and a substrate subsystem 1106, including a reduction lens 1108, among other things, are positionally fixed with respect to one another, and the reticle/substrate subsystem 1106 are laterally scanned in the X-direction across a slit 1110 aligned with an illumination system 1112 by laterally moving the subsystem 1106. Consequently, in the step and scan system 1100, the entire reticle field is not printed at one time, but rather the portion of the reticle field underneath the slit 1110 is printed and the slit 1110 is scanned across the reticle field by the lateral movement of the reticle/substrate subsystem 1106. In this manner, the exposed portion of the reticle field is always within the same fixed portion of the image field in order to maintain the printing within the "sweet spot" of the imaging optics.

Although step and scan systems constitute an improvement in pattern transfer quality, the scanning process can contribute to pattern transfer errors in one or more directions (e.g., the X-direction)) if the subsystem 1106 positioning is not proper for each scan. For example, if the repeated scans of the subsystem 1106 past the slit 1110 are crooked or misaligned or the position of the subsystem 1106 is rotated slightly from its desired position in the "X-Y" plane, errors may be generated in the transferring of the reticle pattern 1104 to the wafer 1120, and more particularly to one or more die 1122 on the wafer 1120. Furthermore, instability in such scanning systems can lead to errors in pattern transfer.

Accordingly, pattern transfers in semiconductor fabrication generally incorporate some type of alignment mechanism to assist with layer to layer alignment during pattern transfer. One technique that facilitates overlay accuracy involves forming one or more alignment marks or patterns on the underlying substrate and each mask. When the alignment marks or patterns on the substrate and mask are optically aligned, for example, then the remainder of the circuit patterns are assumed to be aligned. Another technique utilizes one or more recesses or other features formed within a semiconductor substrate as alignment marks. For example, FIG. 12 illustrates an enlarged fragmentary cross section of a substrate such as a portion of a silicon wafer 1200 having one or more recesses 1202 formed therein which can serve as alignment marks. The recesses 1202 have respective depths 1204 which are functionally related to an alignment radiation wavelength (e.g., a depth of lambda/4). The predetermined depths 1204 provide a diffraction pattern or other destructive interference phenomena upon reflection of a beam of radiation (e.g., white light) off of the marks 1202 which allows the alignment marks 1202 to be more effectively "seen". In this manner, the alignment marks 1202 exhibit a better reflective contrast than the neighboring regions and are thus more visible.

FIG. 13 is a schematic block diagram illustrating a conventional alignment system 1300 utilizing alignment marks 1302, such as that depicted in FIG. 12. An alignment light source 1304 illuminates the grating or plurality of alignment marks 1302 with radiation 1306 and this radiation 1306 has its diffracted orders 1308 reflect off of the alignment marks 1302 and get captured by a lens 1310 and directed toward a mask 1312. The reflected radiation is used as a signal to detect the alignment between the mask 1312 and substrate 1314 containing the marks 1302. As will become apparent in the discussion that follows, however, conventional alignment mark structures suffer from some disadvantages which prevent alignment accuracy from being maximized. There is thus a need in the art for improved alignment structures, systems and techniques.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its purpose is merely to present one or more concepts of the invention in a simplified form as a prelude to the more detailed description that is presented later.

The present invention pertains to utilizing a salicide in establishing alignment marks. A metal layer is formed over exposed portions of a silicon substrate as well as oxide areas formed over bitlines buried within the substrate. The metal layer is treated to react with the exposed portions of the silicon substrate to form salicided areas. The metal layer does not, however, react with the oxide areas. As such, salicided areas are formed adjacent to the oxide areas to reveal a stark optical contrast when light is shined thereupon. In this manner, the alignment marks can be very easily "seen". The enhanced optical contrast allows the marks to continue to be seen as scaling continues.

According to one or more aspects of the present invention, a method of forming and using an alignment mark on a semiconductor substrate is disclosed. The method includes forming buried bitlines within the semiconductor substrate, forming respective oxides over the buried bitlines, forming a metal layer over the substrate, treating the metal layer to form salicides on the substrate adjacent to the oxide areas and removing excess unreacted metal and exposing the salicided and oxide areas.

In accordance with one or more other aspects of the present invention, a method of forming and using an alignment mark on a semiconductor substrate is disclosed. The method includes forming salicides on the substrate adjacent to oxide areas formed on the substrate, the oxide areas being formed over bitlines implanted into the substrate.

According to one or more other aspects of the present invention, an alignment mark formed on a semiconductor substrate is disclosed. The alignment mark includes an oxide area formed over a buried bitline formed within the substrate and a salicide formed on the substrate adjacent to the oxide area.

In accordance with yet other aspects of the present invention, a semiconductor substrate having an alignment mark formed thereon is disclosed. The substrate includes an oxide area formed over a buried bitline formed within the substrate and a salicide formed on the substrate adjacent to the oxide area.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

DETAILED DESCRIPTION OF THE INVENTION

Figure 1:
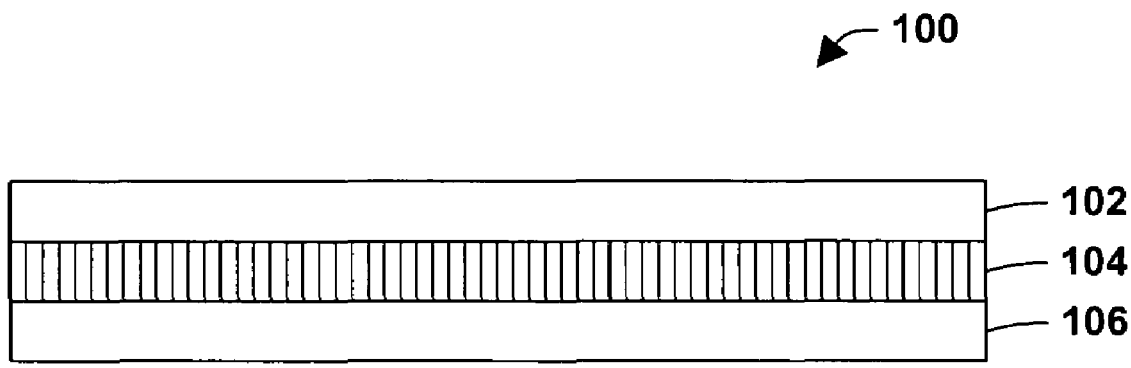
FIGS. 1–6 are cross sectional illustrations of a portion of a wafer illustrating positive and negative resists in a photolithographic process.
Figure 2:
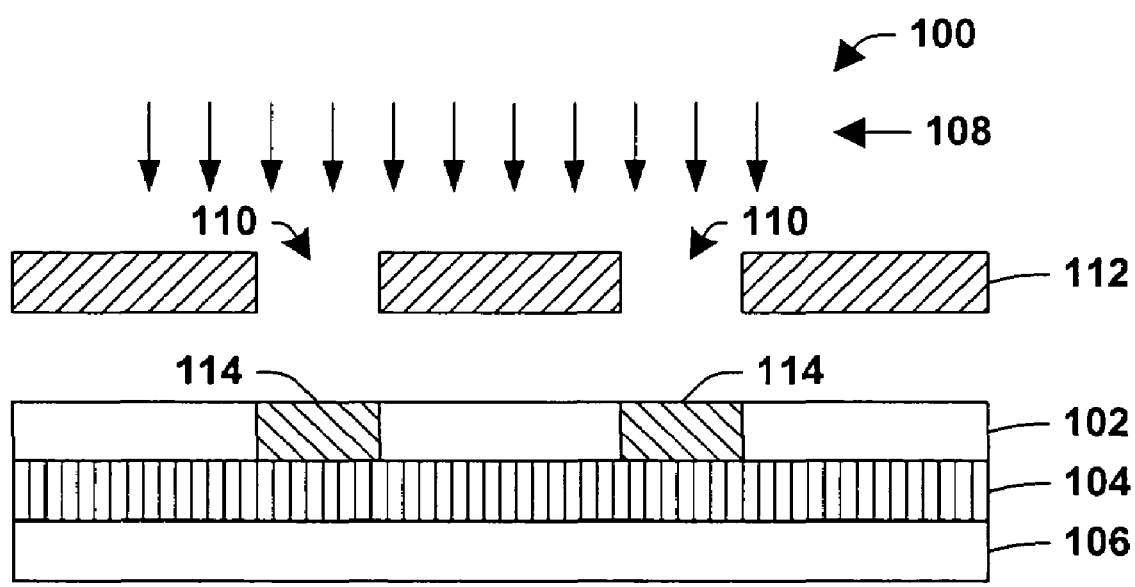
Figure 3:
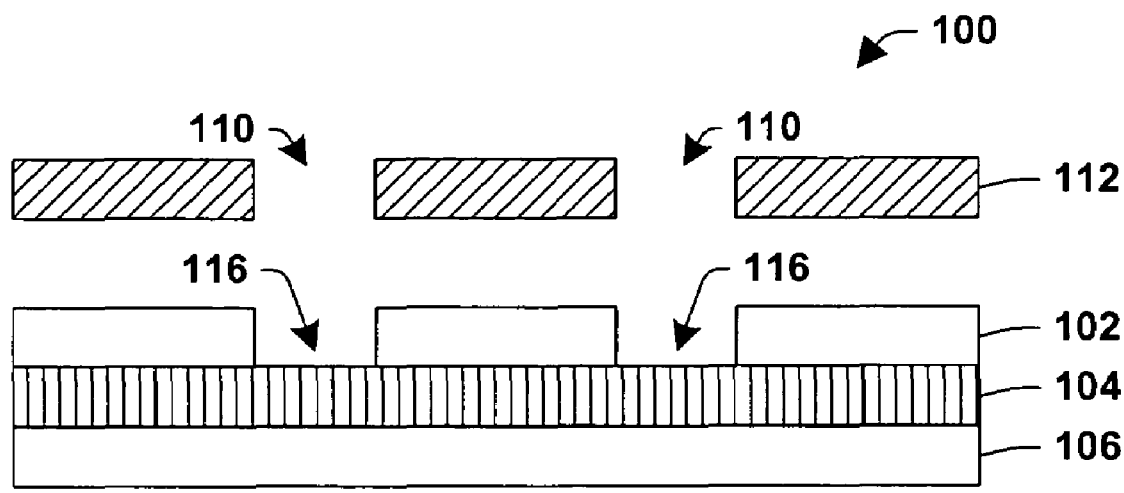
Figure 4:
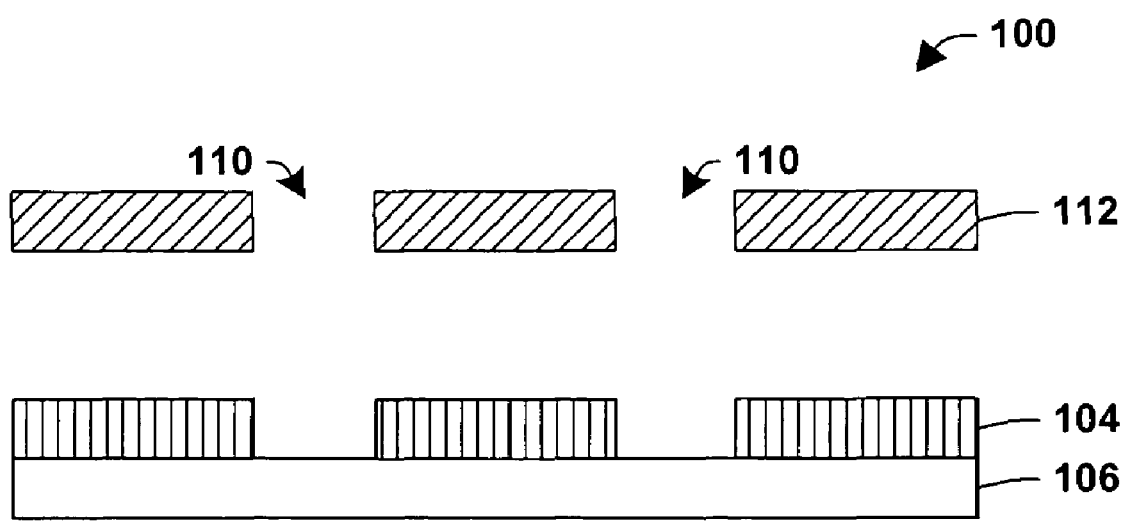
Figure 5:
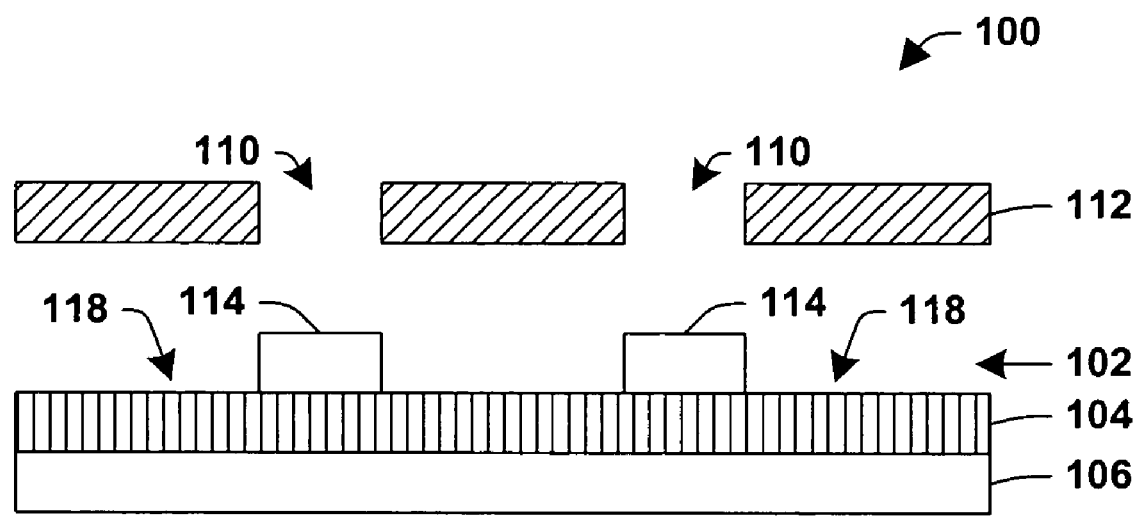
Figure 6:
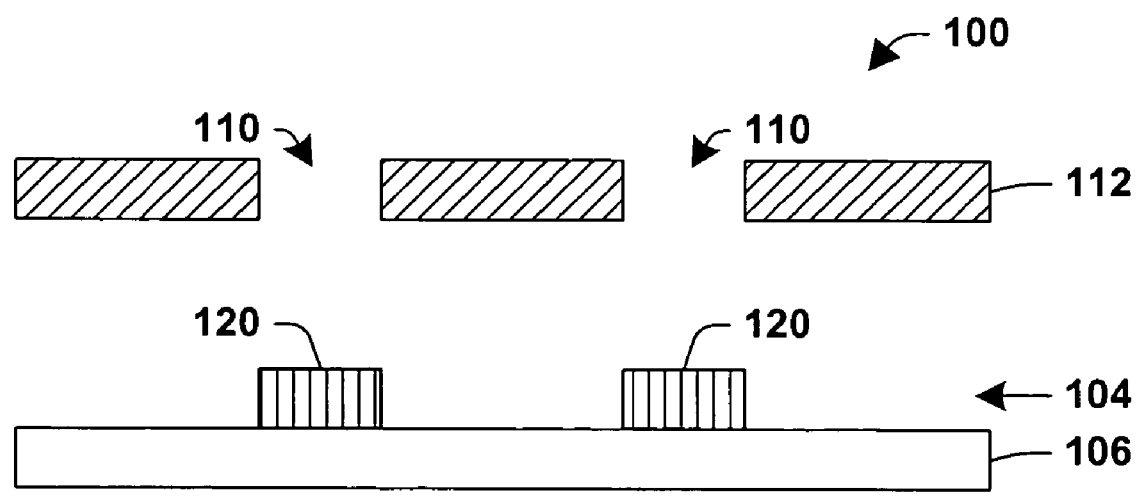
Figure 7:
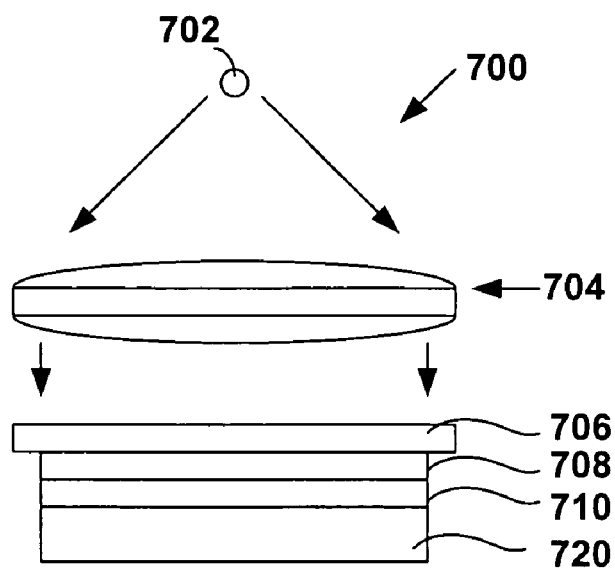
FIGS. 7–13 are schematic illustrations of various prior art techniques of optically transferring patterns between different media.
Figure 8:
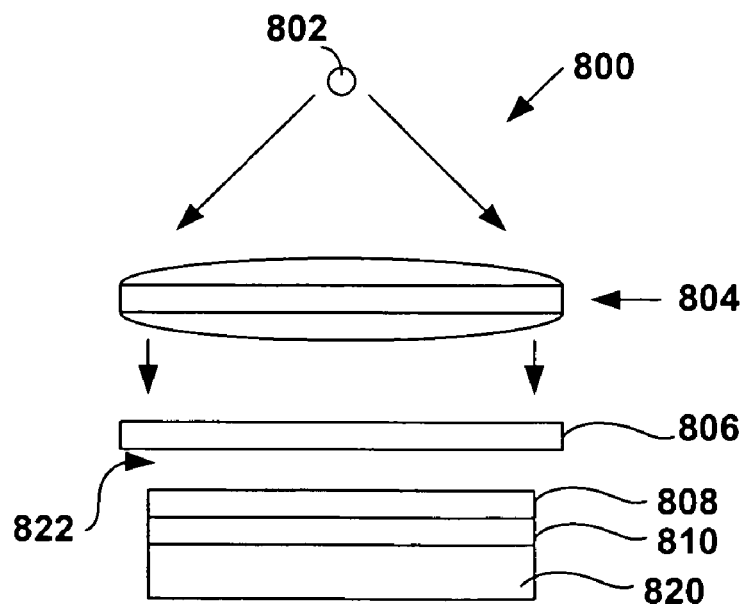
Figure 9:
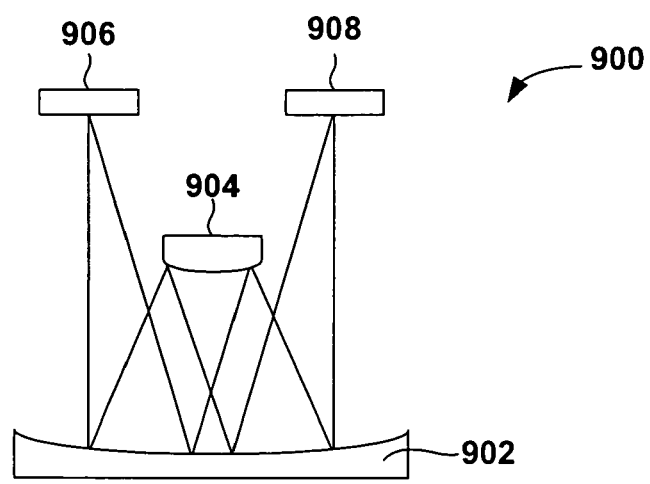
Figure 10:
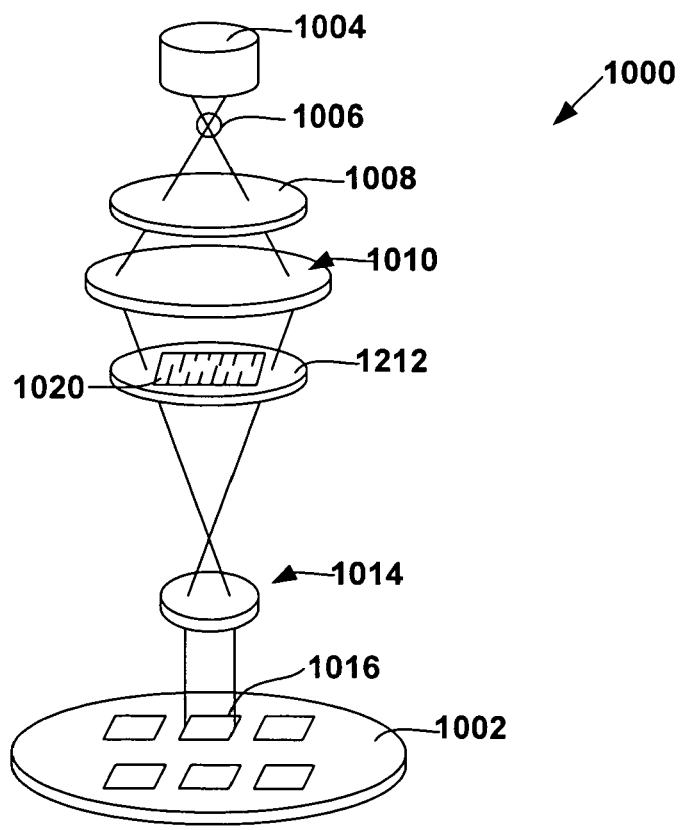
Figure 11:
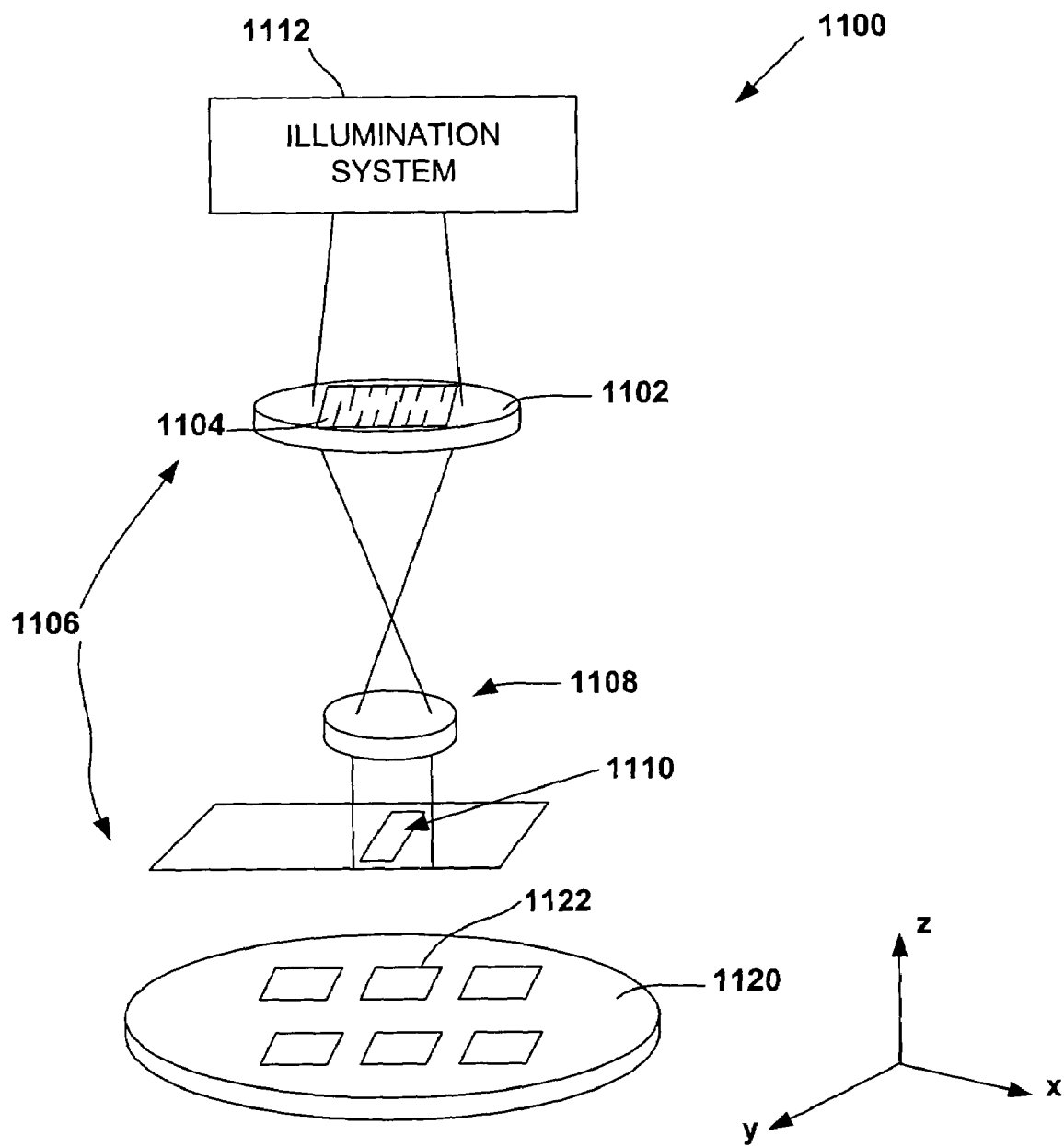
Figure 12:
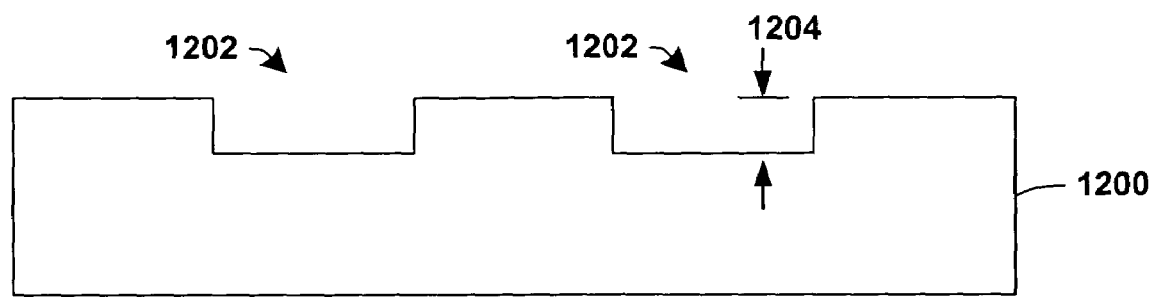
Figure 13:
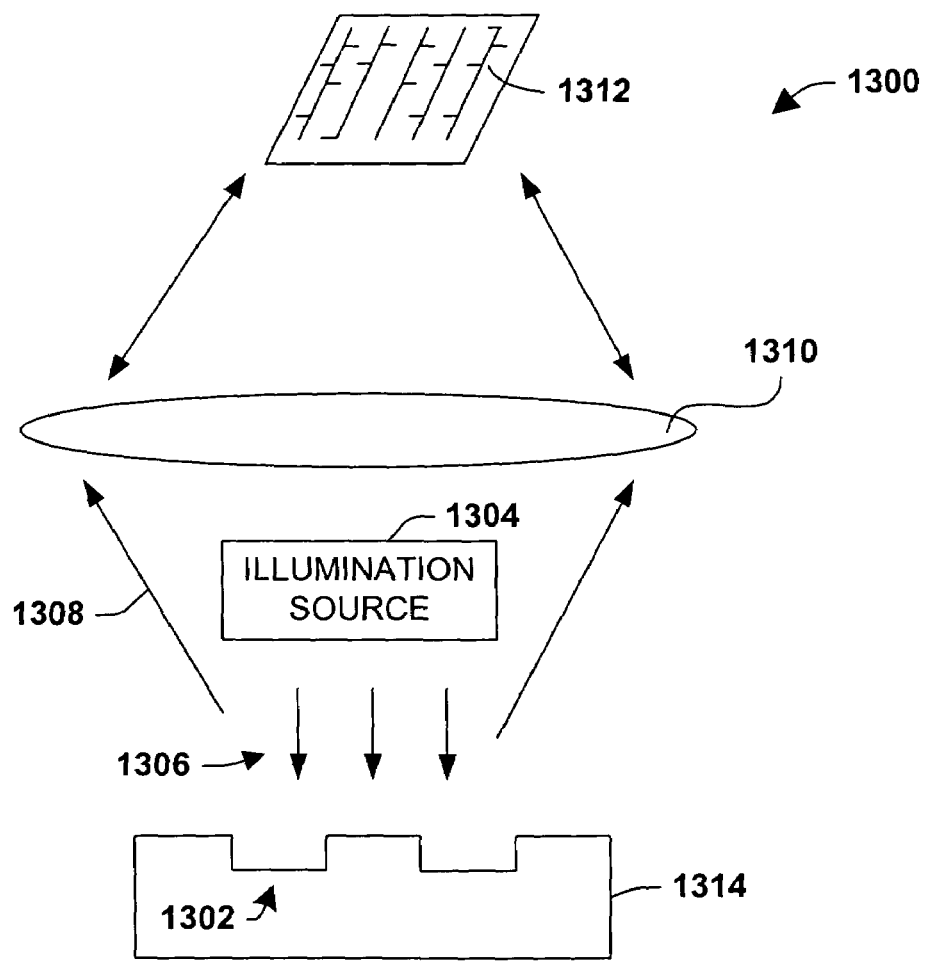

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, that one or more aspects of the present invention may be practiced with a lesser degree of these specific details. In other instances, well-known structures and devices are shown in block diagram form in order to facilitate describing one or more aspects of the present invention.

The present invention pertains to utilizing a salicide to improve optical contrast about an oxide of an alignment mark. More particularly, portions of a substrate adjacent to oxide areas formed over bitlines buried within the substrate are covered with a metal and salicided. The salicided areas and the oxide areas yield a strong optical contrast allowing alignment marks to be more easily "seen". The enhanced contrast allows the marks to continue to be seen as scaling occurs.

Figure 14:
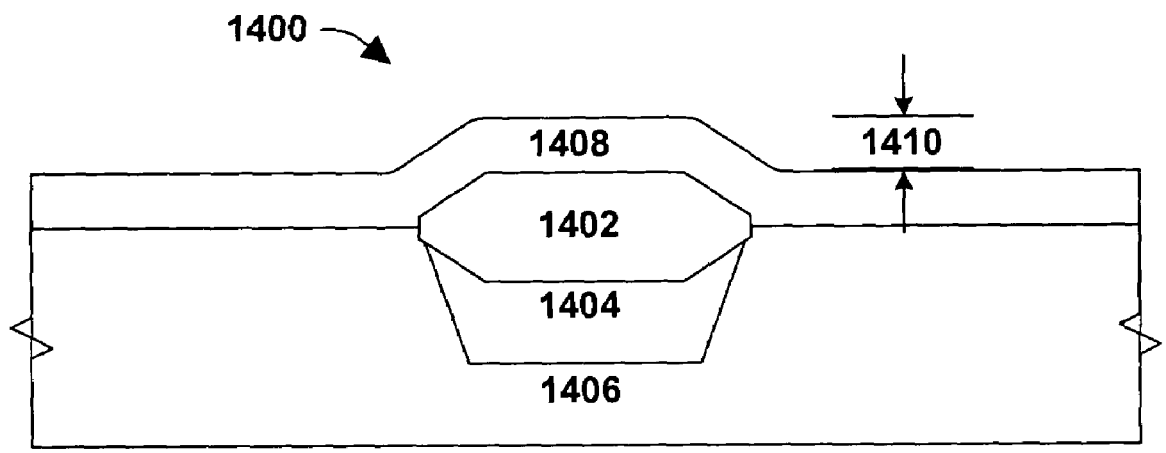
FIGS. 14–15 are cross sectional illustrations depicting how alignment marks can become ineffective for alignment for purposes as scaling occurs.
Figure 15:
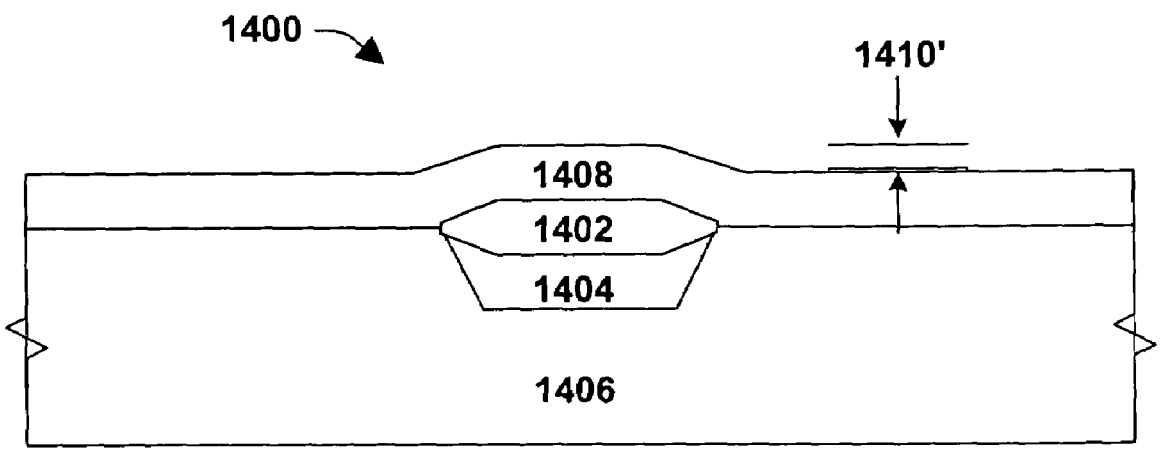

As mentioned above, in the semiconductor arena there is a continuing trend toward reducing device sizes or scaling. This reduction of feature sizes can, however, have an adverse affect on alignment marks. For example, a conventional alignment mark 1400, such as that illustrated in FIG. 14 includes an area of oxide 1402 formed over a bitline 1404 in a substrate 1406, and a layer of nitride 1408 formed over the oxide area 1402. The step height 1410 of the oxide 1402 is transferred to the nitride 1408 and provides some optical contrast allowing the mark 1400 to be seen. However, as scaling occurs and the oxide 1402 is reduced in size as illustrated in FIG. 15, the step height 1410' transferred to the nitride 1408 is reduced and the contrast provided thereby is also correspondingly reduced. Accordingly, the alignment mark 1400 becomes more difficult to see and less useful for alignment purposes as scaling occurs.

Figure 16:
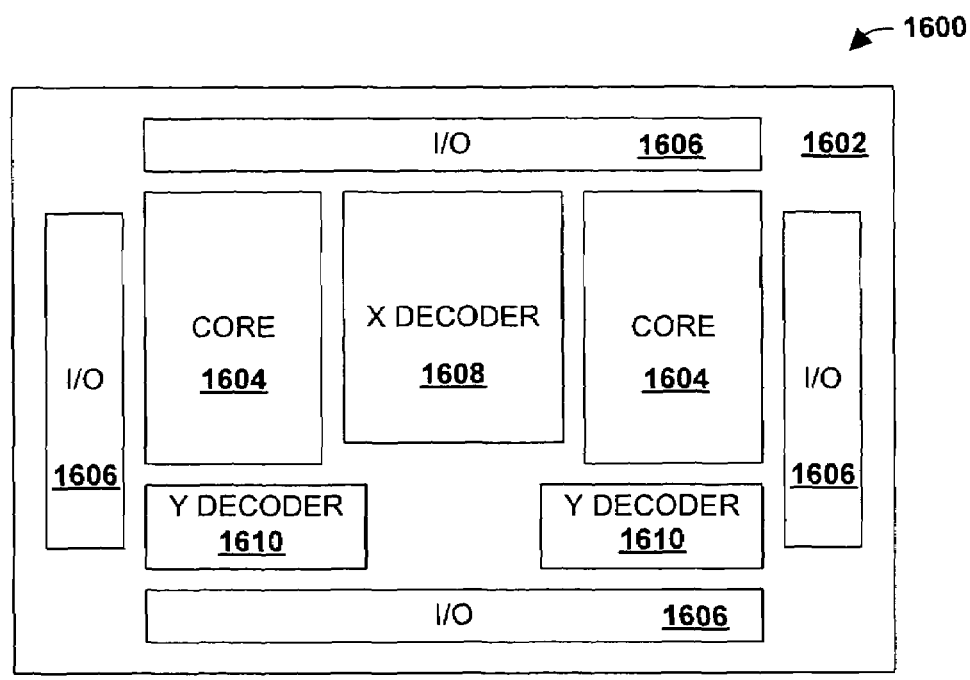
FIG. 16 is a schematic top view of an exemplary flash memory device capable of being formed on a semiconductor device that incorporates alignment marks as described herein.

As a matter of reference, FIG. 16 depicts a top view of an exemplary semiconductor device 1600. The particular arrangement shown corresponds to a dual bit flash electrically erasable programmable read only memory (EEPROM). Like most semiconductor devices, the memory 1600 is made up of both active and inactive or passive regions on a semiconductor substrate 1602. The active regions include, for example, one or more high-density core regions 1604 and one or more lower-density peripheral portions. By way of example, the high-density core regions typically include one or more M by N arrays of individually addressable, substantially identical dual bit flash memory cells.

The lower-density peripheral portions, on the other hand, typically include input/output (I/O) circuitry 1606 and programming circuitry for selectively addressing the individual memory cells. The programming circuitry is represented in part by and includes one or more x-decoders 1608 and one or more y-decoders 1610 that cooperate with the I/O circuitry 1606 for selectively connecting a source, gate, and/or drain of selected addressed memory cells to predetermined voltages or impedances to effect designated operations on the respective memory cells (e.g., programming, reading, and erasing, and deriving necessary voltages to effect such operations). As such, it can be appreciated that while the active regions correspond to productive portions of the substrate, the inactive regions, on the other hand, correspond to portions of the substrate that are not utilized or are not necessarily productive.

Figure 17:
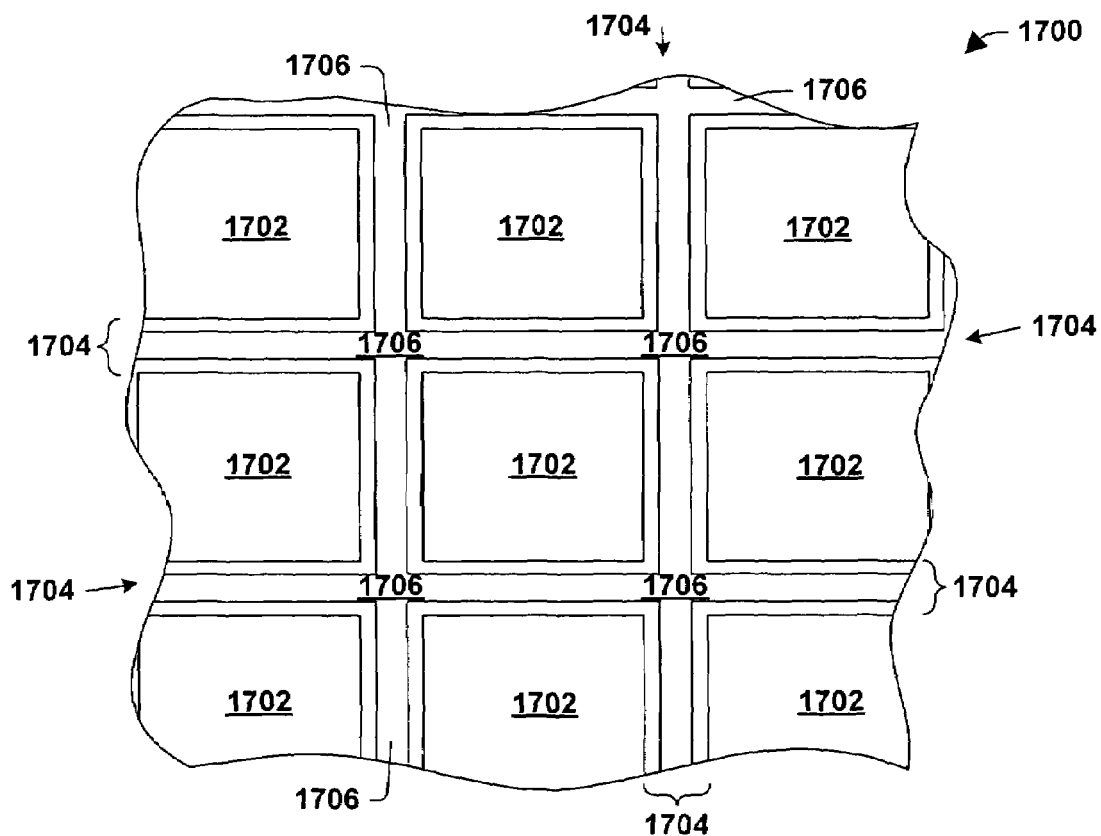
FIG. 17 is a schematic top view of a portion of a semiconductor substrate or wafer having a plurality of die separated by scribe lines situated thereon.

FIG. 17 is a top view of a portion of a semiconductor substrate or wafer 1700 having a plurality of die 1702 situated thereon. The region of the wafer depicted may, for example, correspond to an image field of a lithographic printing tool (i.e., a stepper having an image field that includes a plurality of die). The die 1702 comprise active (as well as some inactive) areas of the wafer whereon one or more semiconductor devices, such as that depicted in FIG. 16, may be formed. The die 1702 are separated by scribe lines 1704 which are inactive sacrificial portions of the wafer that provide an easy and nondestructive means for removing the die 1702 from the wafer 1700 once fabrication is complete. Generally, a saw is utilized to cut along the scribe lines 1704 and remove the individual die 1702 from the wafer 1700.

In the illustrated example, an optional oxide formation 1706 is present throughout the scribe lines 1704. The oxide can, for example, be formed by shallow trench isolation (STI) and/or local oxidation of silicon (LOCOS), and serves to separate or electrically isolate the die from one another, thereby mitigating unwanted electrical interaction or cross talk between the respective die 1702 or components formed thereon. It will be appreciated that alignment marks formed according to techniques described herein can be formed on any one or more areas of a wafer, including both active and inactive regions, for example.

Figure 18:
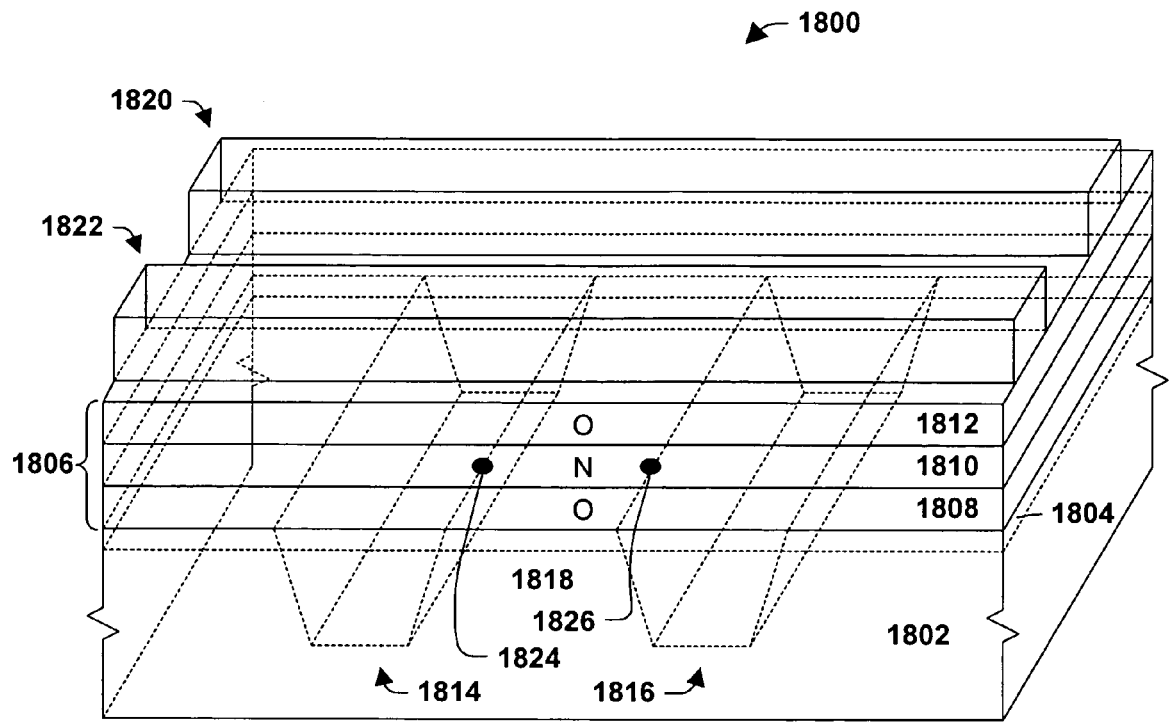
FIG. 18 is a cross-sectional isometric illustration of a portion of a dual bit flash memory, such as what may comprise some of what is depicted in FIG. 16.
Figure 19:
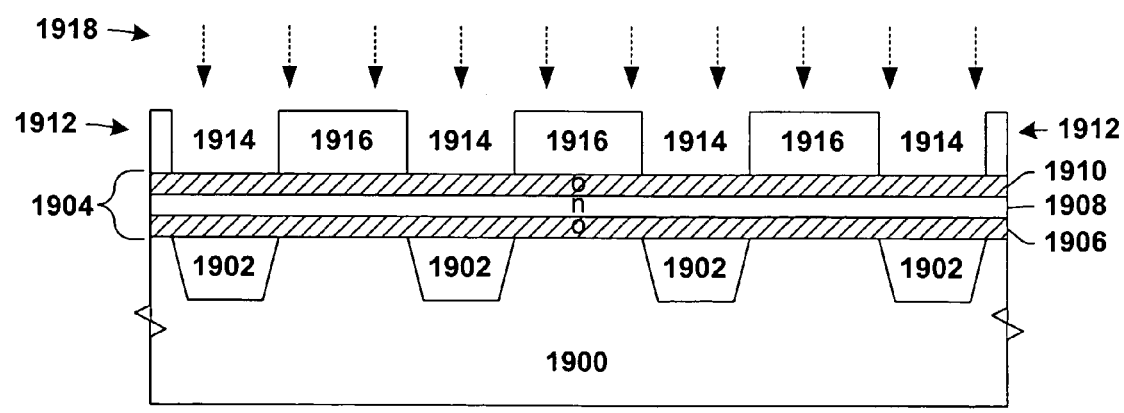
FIGS. 19–25 are cross sectional illustration of a portion of a semiconductor substrate depicting the formation of an alignment mark in accordance with one or more aspects of the present invention.

FIG. 18 is a cross-sectional isometric illustration of a portion 1800 of a dual bit flash memory, such as that which may comprise some of what is depicted in FIG. 16. A semiconductor substrate 1802 upon which the memory is formed is doped with a p-type impurity such as boron, for example, to establish a threshold adjustment implant ($V_{tad\text{-}just}$) region 1804 therein. The threshold adjustment implant provides a region 1804 that is more heavily doped than the semiconductor substrate 1802. The substrate can, for example, be formed out of silicon and can itself be doped with a p-type impurity. The threshold adjustment implant 1804 assists in controlling a threshold voltage of the various cells within the memory 1800.

A charge-trapping dielectric layer 1806 is deposited over the semiconductor substrate 1802. The charge-trapping dielectric layer 1806 generally can be composed of three separate layers: a first insulating layer 1808, a charge-trapping layer 1810, and a second insulating layer 1812. The first and second insulating layers 1808 and 1812 are typically formed of an oxide dielectric such as silicon dioxide ($SiO_2$) and the charge-trapping layer 1810 is generally formed of a nitride dielectric such as silicon nitride ($Si_xN_y$). As such, the charge trapping dielectric layer 1806 is commonly referred to as an ONO layer.

First and second conductive bitlines 1814 and 1816 are depicted in FIG. 18 underlying the charge trapping dielectric layer 1806. It will be appreciated that any number of such bitlines can be implanted into the semiconductor substrate 1802. The bitlines 1814, 1816 are typically formed of an implanted n-type material, such as arsenic, and may include an oxide portion (not shown) in some examples. The first and second conductive bitlines 1814 and 1816 are spaced apart and define a channel region 1818 there-between.

First and second conductive wordlines 1820, 1822 are similarly depicted overlying the charge-trapping dielectric layer 1806. It will be appreciated that any number of such wordlines can be formed over the dielectric layer 1806. The wordlines 1820, 1822 can be formed out of a polysilicon material, for example, where the polysilicon material may be deposited over the dielectric layer 1806 and then patterned (e.g., etched). Locations 1824 and 1826 indicate generally where respective bits of data can be stored in one or the cells of the memory 1800.

Turning to FIGS. 19–25, cross-sectional illustrations of a portion of a semiconductor substrate 1900 are shown to depict the formation of an alignment mark in accordance with one or more aspects of the present invention. With initial reference to FIG. 19, the substrate 1900 has one or more buried bitlines 1902 formed therein and one or more layers of a charge trapping dielectric layer 1904 formed there-over. In the example illustrated, three layers of the charge trapping dielectric layer 1904 are formed over the substrate 1900, namely a first insulating layer 1906, a charge-trapping layer 1908, and a second insulating layer 1910. The first and second insulating layers 1906 and 1910 typically include an oxide dielectric such as silicon dioxide ($SiO_2$) and the charge-trapping layer 1908 generally includes a nitride dielectric such as silicon nitride ($Si_xN_y$). The oxide-nitride-oxide configuration is commonly referred to as an ONO layer for convenience. It will be appreciated, however, that other types of charge-trapping layers may be employed and are contemplated as falling within the scope of the present invention.

A layer of resist material 1912 is formed over the charge trapping dielectric layer 1904 and is patterned to have spacings 1914 between patterned resist features 1916. The spacings allow a dopant 1918 to pass there-through and establish the buried bitlines. It will be appreciated that the dopant 1918 also passes through the one or more layers of the charge trapping dielectric layer 1904 in establishing the buried bitlines. Further, if less than all of the layers of the charge trapping dielectric layer 1904 are formed before the resist 1912 is formed and patterned and the dopant implant is performed, then the remaining layers of the charge trapping dielectric layer 1904 can subsequently be applied there-after. Additionally, besides being performed in alignment mark regions, the bitline implant is also generally performed in core array areas, but is not typically performed in peripheral circuitry areas.

Figure 20:
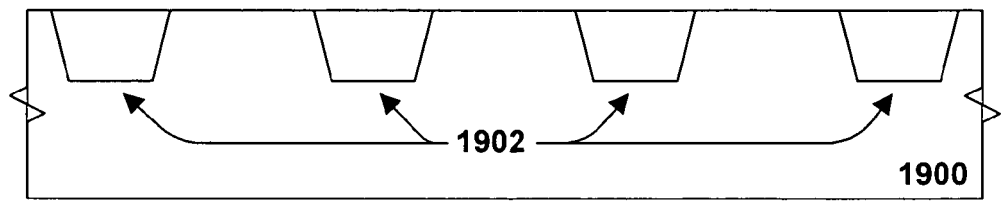

FIG. 20 shows that the charge trapping dielectric layer 1904 and the remaining resist features 1916 are removed (e.g., chemically stripped, etched) from the substrate 1900 after the bitline implant is performed. It will be appreciated that this generally does not occur in places other than alignment mark regions. By way of example, the alignment marks described herein can be located within scribe lines on a wafer, such as those depicted in FIG. 17. In this manner, efficient use is made of valuable wafer real estate since the scribe lines are sacrificial inactive areas. However, the present invention contemplates forming alignment marks according to one or more aspects described herein at any suitable locations on a wafer or substrate.

Figure 21:
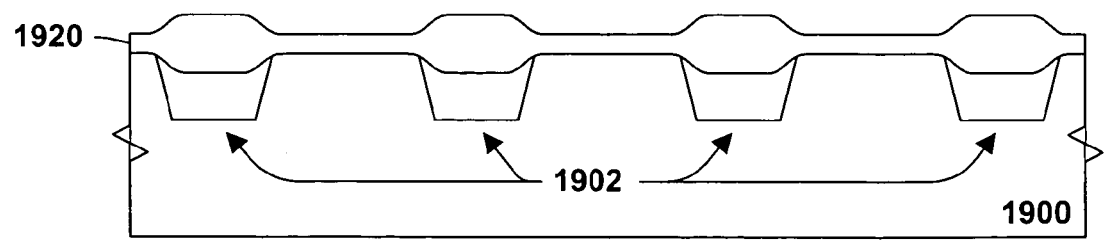

FIG. 21 illustrates that a layer of oxide material 1920 is then formed (e.g., grown via dopant enhancement oxidation) over the substrate 1900. It will be appreciated that more oxide is grown over the buried bitlines than in other regions of the substrate 1900. This is due to the fact that the dopant 1918 introduces a lot of defects into the surface of the substrate and these defects enhance oxidation. Such oxidation generally occurs in alignment mark regions, but does not occur in core areas because the core areas are typically protected by a layer of nitride material formed there-over. Additionally, such oxidation does not usually occur in peripheral circuit regions as those regions receive little to no bitline dopant 1918.

Figure 22:
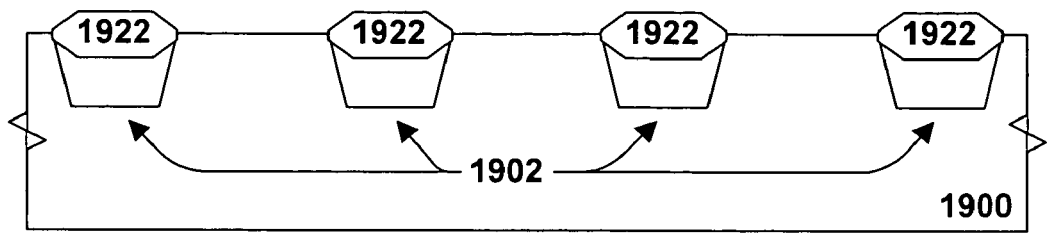

As depicted in FIG. 22, some of the oxide material 1920 is then removed (e.g., via etching) so as to leave portions 1922 of the oxide over the buried bitlines, but not on the surrounding or adjacent areas of the substrate 1900. It will be appreciated that core array areas are protecting by the layer of nitride material and thus remain generally unaffected during the oxide removal process. For example, an etchant utilized in the oxide removal process may be selective with respect to nitride materials. Removing the oxide from the surface of the substrate 1900 allows a subsequently applied metal to react with the silicon in the substrate 1900.

Figure 23:
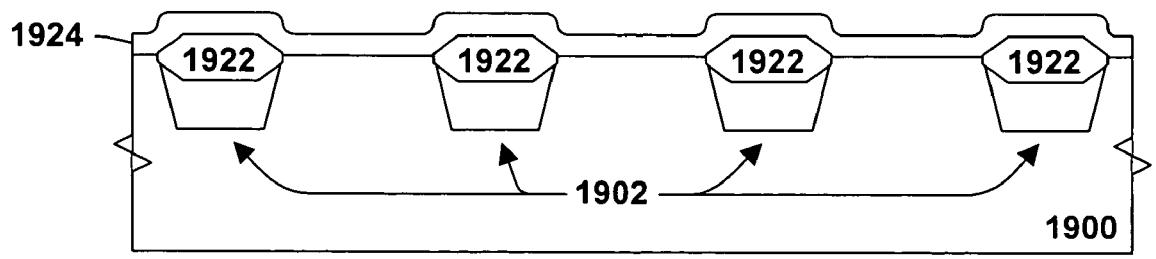
Figure 24:
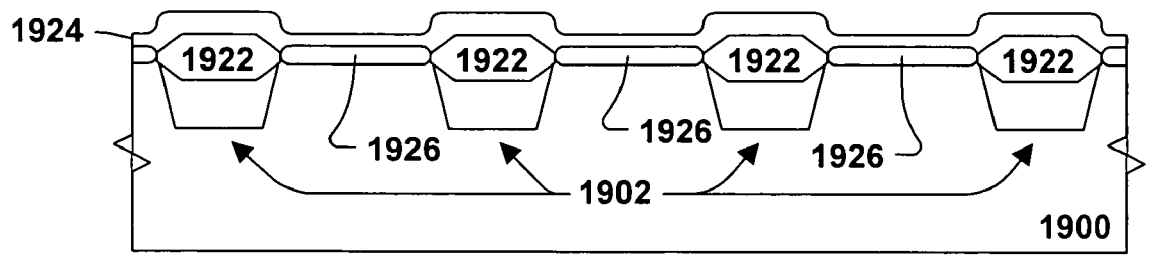
Figure 25:
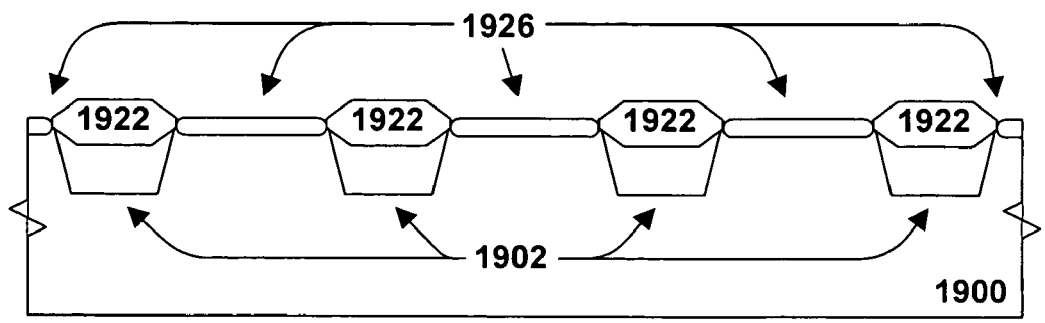

Accordingly, FIG. 23 illustrates that a layer of metal material 1924 (e.g., titanium (Ti), cobalt (Co) and nickel (Ni)) is then formed over the exposed areas of the substrate 1900 and the oxide portions 1922. The layer of metal may, for example, be spun-on or deposited over the substrate, or applied in any other suitable manner. FIG. 24 shows that the layer of metal 1924 is then treated (e.g., heated, annealed) so as to react with silicon near the surface of the substrate 1900. The metal does not, however, react with the oxide portions 1922 formed over the bitlines 1902. In this manner, salicide areas 1926 are formed adjacent to the oxide portions 1922. As depicted in FIG. 25, excess unreacted metal is then removed (e.g., stripped, washed, chemically etched) from the substrate, leaving the salicide areas 1926 and oxide portions 1922 exposed. The salicide areas 1926 and adjacent oxide portions 1922 provide a great deal of contrast when light is reflected there-from. In this manner, an alignment mark made up of a salicide and adjacent oxide portion continues to be "visible" even as scaling occurs.

Figure 26:
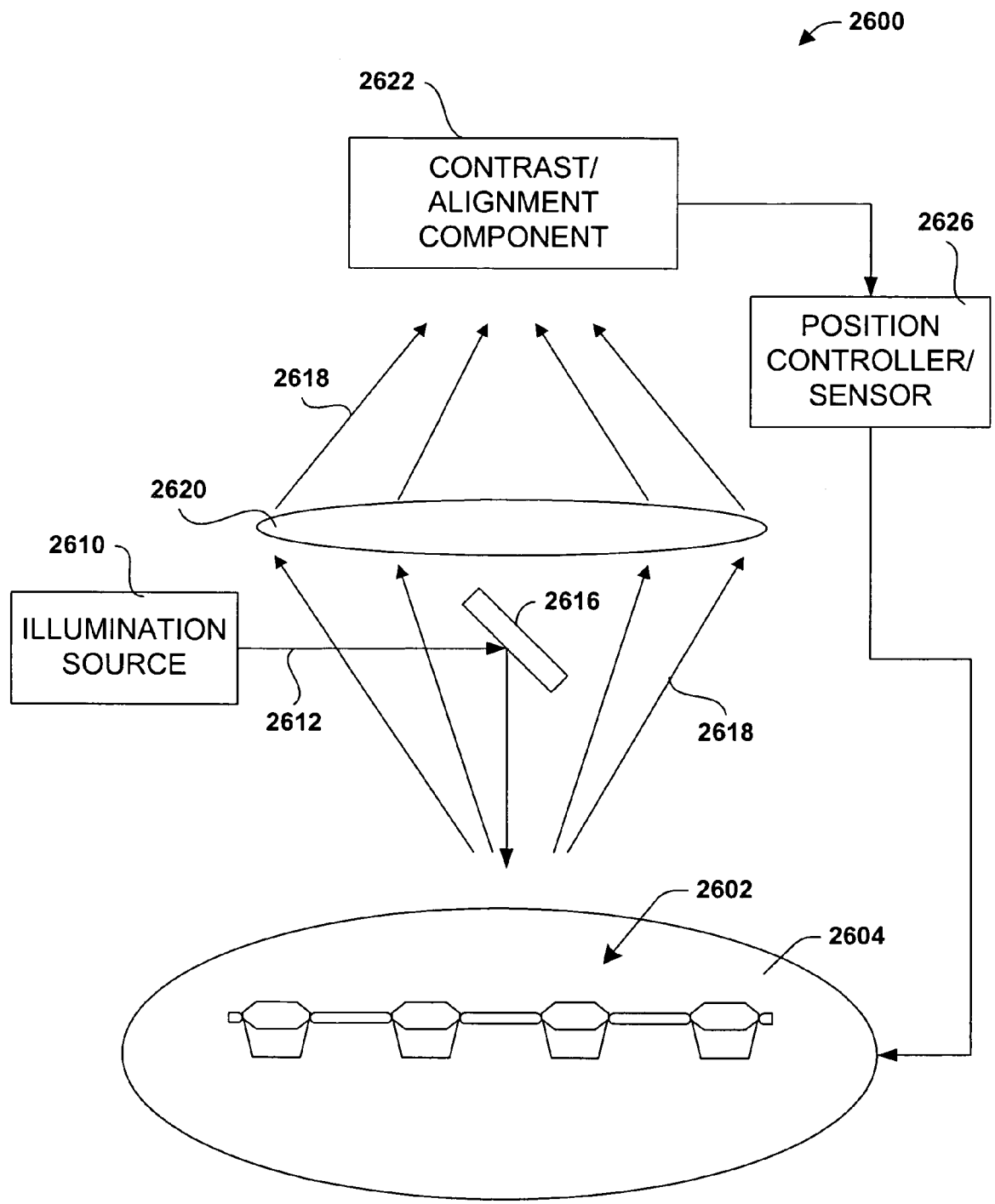
FIG. 26 is a schematic illustration of an exemplary alignment system employing one or more alignment marks formed in accordance with one or more aspects of the present invention.

By way of further example, FIG. 26 illustrates an exemplary alignment system 2600 employing one or more alignment marks 2602 formed on a wafer or substrate 2604 in accordance with one or more aspects of the present invention. In the illustrated example, the alignment marks 2602 correspond to those depicted in FIG. 25. It will be appreciated that the elements and features set forth in FIG. 26 may be drastically out of scale and that the alignment marks 2602 are sized differently from those represented in other Figs. for purposes of illustration.

The system 2600 includes an alignment light source 2610, such as a laser, etc., which selectively directs alignment light 2612 toward a portion of the substrate 2604 via an imaging system (e.g., a mirror 2616). The light 2612 has its orders diffracted by oxide and salicide regions of the marks 2602. As such, light 2618 reflected from the marks exhibits a contrast due to the oxide and salicide regions of the marks 2602. In the illustrated example, the reflected light 2618 is captured by a lens 2620 and imaged back towards an alignment component 2622 that facilitates a determination of contrast for alignment purposes. A position controller/sensor 2626 (e.g., a motor, computer controlled stage, stepper or other type substrate positioning mechanism, etc.) is coupled to the component 2622 and substrate 2604. The position controller/sensor 2626 utilizes data from the alignment component 2622 to develop one or more control signals to selectively maneuver the substrate 2602 and facilitate appropriate alignment.

Accordingly, it will be appreciated that alignment marks formed as set forth herein facilitate a greater degree of contrast relative to surrounding areas of a wafer or substrate. As such, when the mark is utilized within an alignment system and radiation is directed at the mark, better layer to layer alignment and an improved fidelity of pattern registration can be achieved.

Figure 27:
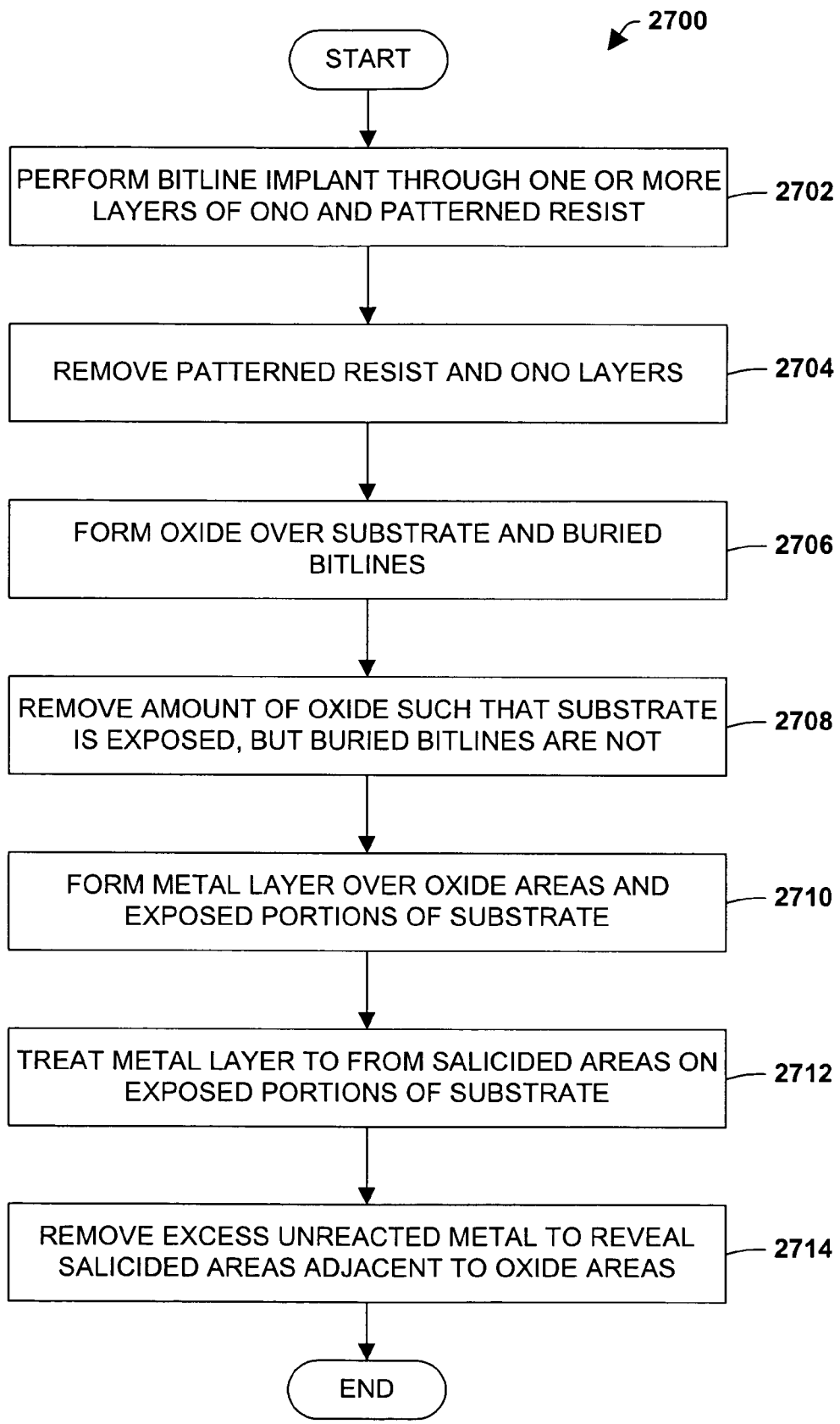
FIG. 27 is a flow diagram illustrating an exemplary methodology for forming an alignment mark in accordance with one or more aspects of the present invention.

Referring now to FIG. 27, an exemplary methodology 2700 is illustrated for forming a using an alignment mark in accordance with one or more aspects of the present invention. Although the methodology 2700 is illustrated and described hereinafter as a series of acts or events, it will be appreciated that the present invention is not limited by the illustrated ordering of such acts or events. For example, some acts or events may occur in different orders and/or concurrently with other acts or events described herein as well as with other acts or events not described herein. In addition, not all illustrated acts may be required to implement a methodology according to one or more aspects of the present invention. Furthermore, the methodologies according to the present invention may be implemented in association with the formation and/or processing of structures illustrated and described herein as well as in association with other structures not illustrated or described herein.

The methodology begins at 2702 where bitline implants are performed to form buried bitlines within a substrate. The implants are performed through one or more layers of a charge trapping dielectric layer formed over the substrate and a patterned photoresist formed over the charge trapping dielectric layer. The charge trapping dielectric layer generally includes three layers, namely a first insulating layer, a charge-trapping layer, and a second insulating layer. The first and second insulating layers and typically include an oxide dielectric such as silicon dioxide ($SiO_2$) and the charge-trapping layer generally includes a nitride dielectric such as silicon nitride ($Si_xN_y$). The oxide-nitride-oxide configuration is commonly referred to as an ONO layer for convenience. It will be appreciated, however, that other types of charge-trapping layers may be employed and are contemplated as falling within the scope of the present invention.

The layer of resist material is patterned so as to have spacings between patterned resist features. The spacings allow a dopant to pass there-through to establish the buried bitlines. It will be appreciated that the dopant also passes through the one or more layers of the charge trapping dielectric layer in establishing the buried bitlines. It will be further appreciated that if less than all of the layers of the charge trapping dielectric layer are formed before the resist is formed and patterned and the dopant implant is performed, then the remaining layers of the charge trapping dielectric layer can subsequently be applied there-after. Additionally, besides being performed in alignment mark regions, the bitline implant is also generally performed in core array areas, but is not typically performed in peripheral circuitry areas.

Then, at 2704 the charge trapping dielectric layer and the remaining resist features are removed (e.g., chemically stripped, etched) from the substrate after the bitline implant is performed. It will be appreciated that this generally does not occur in places other than alignment mark regions. By way of example, the alignment marks described herein can be located within scribe lines on a wafer. In this manner, efficient use is made of valuable wafer real estate since the scribe lines are sacrificial inactive areas. However, the present invention contemplates forming alignment marks according to one or more aspects described herein at any suitable locations on a wafer or substrate.

At 2706, a layer of oxide material is then formed (e.g., grown via dopant enhancement oxidation) over the substrate and bitline areas. It will be appreciated that more oxide is grown over the buried bitlines than in other regions of the substrate. This is because the dopant introduces a lot of defects into the surface of the substrate during the implantation process and these defects enhance oxidation. Such oxidation generally occurs in alignment mark regions, but does not occur in core areas because the core areas are typically protected by a layer of nitride material formed there-over. Additionally, such oxidation does not usually occur in peripheral circuit regions as those regions receive little to no bitline dopant to catalyze the oxidation.

At 2708, some of the oxide material is then removed (e.g., via etching) so as to leave some oxide over the buried bitlines, but not over the surrounding or adjacent areas of the substrate. It will be appreciated that core array areas are protecting by the layer of nitride material and thus remain generally unaffected during the oxide removal process. For example, an etchant utilized in the oxide removal process may be selective with respect to nitride materials. Removing the oxide from the surface of the substrate allows a subsequently applied metal to react with the silicon in the substrate.

Accordingly, at 2710 a layer of metal material (e.g., titanium (Ti), cobalt (Co) and nickel (Ni)) is then formed over the exposed areas of the substrate and the remaining oxide portions. The layer of metal may, for example, be spun-on or deposited over the substrate, or applied in any other suitable manner. At 2712, the layer of metal is treated (e.g., heated, annealed) so as to react with silicon near the surface of the substrate. The metal does not, however, react with the oxide portions remaining over the bitlines. In this manner, salicide areas are formed adjacent to the oxide portions.

Then, at 2714 excess unreacted metal is removed (e.g., stripped, washed, chemically etched) from the substrate, leaving the salicide areas and oxide portions exposed. The salicide areas and adjacent oxide portions provide a great deal of contrast when light is reflected there-from. In this manner, an alignment mark made up of a salicide and adjacent oxide portion continues to be "visible" even as scaling occurs.

It is to be appreciated that the elements depicted and described herein in association with the accompanying figures and drawings are depicted with particular dimensions relative to one another (e.g., layer to layer dimensions and/or orientations) for demonstrative purposes and simplicity and ease of understanding, and that they may not be drawn to scale and that the actual dimensions of the elements may differ substantially from that shown and described herein. It is also to be appreciated that reference to substrate or semiconductor substrate as used herein can include a base semiconductor wafer (e.g., silicon, SiGe, or an SOI wafer) and any epitaxial layers or other type semiconductor layers formed thereover or associated therewith. Also, reference to the term exemplary herein is not meant to mean the best or pinnacle, but rather merely an example of something. It is to be still further appreciated that one or more of the layers or formations shown and described herein can be formed in any suitable number of ways, either alone or in combination, such as with spin-on techniques, sputtering techniques (e.g., magnetron or ion beam sputtering), growth and/or deposition techniques (e.g., chemical vapor deposition (CVD), atomic layer deposition (ALD)) and/or etching, for example.

Although the invention has been shown and described with respect to one or more implementations, equivalent alterations and modifications will occur based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming and using an alignment mark on a semiconductor substrate comprising:
   forming buried bitlines within the semiconductor substrate, the buried bitlines having respective widths;
   forming respective oxides over the buried bitlines, the oxides having respective widths that are greater than or equal to the widths of the buried bitlines such that the bitlines are completely covered by the respective oxides;
   forming a metal layer over the substrate;
   treating the metal layer to form salicides on the substrate adjacent to the oxide areas but not over the buried bitlines; and
   removing excess unreacted metal and exposing the salicided and oxide areas.

2. The method of claim 1, further comprising:
   shining a light at the salicided and oxide areas; and
   observing a contrast between light reflected from the salicided and oxide areas.

3. The method of claim 2, further comprising:
   utilizing the contrast to determine a condition of alignment.

4. The method of claim 3, further comprising:
   selectively adjusting an orientation of the substrate based upon the determined condition of alignment.

5. The method of claim 1, wherein the metal layer comprises at least one of titanium (Ti), cobalt (Co) and nickel (Ni).

6. The method of claim 1, wherein the respective oxides are formed by forming a layer of oxide material over the buried bitlines and exposed portions of the silicon substrate, and removing some of the oxide material such that oxide remains over the buried bitlines, but not over portions of the substrate adjacent thereto.

7. The method of claim 6, wherein some of the oxide is removed via etching.

8. The method of claim 6, wherein the layer of oxide material is formed by dopant enhancement oxidation.

9. The method of claim 1, wherein forming buried bitlines comprises:
   implanting a dopant through one or more apertures defined within a patterned resist mask and through one or more oxide-nitride-oxide (ONO) layers formed over the substrate and underlying the patterned resist mask; and
   removing the one or more ONO layers and patterned resist mask overlying the buried bitlines.

10. The method of claim 9, wherein the one or more ONO layers define a charge-trapping dielectric layer.

11. The method of claim 9, wherein the charge-trapping dielectric layer includes a first insulating layer of silicon dioxide ($SiO_2$), a charge-trapping layer of silicon nitride ($Si_xN_y$), and a second insulating layer of silicon dioxide ($SiO_2$).

12. A method of forming and using an alignment mark on a semiconductor substrate comprising:
    forming salicides on the substrate adjacent to oxide areas formed on the substrate, the oxide areas being formed over bitlines implanted into the substrate and being formed to respective widths that are greater than or equal to respective widths of the bitlines such that the bitlines are completely covered by the respective oxides and the salicides are not formed over the bitlines.

13. The method of claim 12, further comprising:
    shining a light at the substrate, the light being reflected differently from the salicided and oxide areas to yield contrast data.

14. The method of claim 13, further comprising:
    utilizing contrast data to develop one or more control signals that facilitate selective maneuvering of the substrate to establish appropriate alignment.

15. An alignment mark formed on a semiconductor substrate, comprising:
    an oxide area formed over a buried bitline formed within the substrate; and
    a salicide formed on the substrate adjacent to the oxide area, where the oxide area is formed to a width that is greater than or equal to the width of the bitline such that the bitline is completely covered by the oxide and the salicide is not formed over the bitline.

16. The alignment mark of claim 15, wherein the salicide and oxide area provide an optical contrast when light is directed at and reflected from the same.

17. The alignment mark of claim 16, wherein the contrast provided by the salicide and oxide areas can be utilized to develop one or more control signals that facilitate selective maneuvering of the substrate to establish appropriate alignment.

18. A semiconductor substrate having an alignment mark formed thereon comprising:
    an oxide area formed over a buried bitline formed within the substrate; and
    a salicide formed on the substrate adjacent to the oxide area, where the oxide area is formed to a width that is greater than or equal to the width of the bitline such that the bitline is completely covered by the oxide and the salicide is not formed over the bitline.

19. The semiconductor substrate of claim 18, wherein the salicide and oxide area provide an optical contrast when light is directed at and reflected from the same.

20. The semiconductor substrate of claim 19, wherein the contrast provided by the salicide and oxide areas can be utilized to develop one or more control signals that facilitate selective maneuvering of the substrate to establish appropriate alignment.

* * * * *